(12) United States Patent
Takashima et al.

(10) Patent No.: US 11,322,342 B2
(45) Date of Patent: May 3, 2022

(54) MASS SEPARATOR USING RETRACTABLE MAGNETIC YOKE ON A BEAM BENDING PATH

(71) Applicant: Nissin Ion Equipment Co., Ltd., Kyoto (JP)

(72) Inventors: Daiki Takashima, Kyoto (JP); Ippei Nishimura, Kyoto (JP)

(73) Assignee: NISSIN ION EQUIPMENT CO., LTD., Kyoto (JP)

( * ) Notice: Subject to any disclaimer, the term of this patent is extended or adjusted under 35 U.S.C. 154(b) by 104 days.

(21) Appl. No.: 16/815,048

(22) Filed: Mar. 11, 2020

(65) Prior Publication Data

US 2020/0312651 A1 Oct. 1, 2020

(30) Foreign Application Priority Data

Mar. 27, 2019 (JP) .............................. JP2019-059842

(51) Int. Cl.
*H01J 49/30* (2006.01)
*H01J 49/02* (2006.01)

(52) U.S. Cl.
CPC .............. *H01J 49/30* (2013.01); *H01J 49/02* (2013.01)

(58) Field of Classification Search
None
See application file for complete search history.

(56) References Cited

U.S. PATENT DOCUMENTS

| 4,847,504 A | * | 7/1989 | Aitken | H01J 27/022 |
| | | | | 250/492.2 |
| 5,263,381 A | * | 11/1993 | Shirai | F16H 25/2209 |
| | | | | 74/441 |
| 2005/0223991 A1 | * | 10/2005 | Walther | H01J 37/3299 |
| | | | | 118/723 R |
| 2016/0189927 A1 | * | 6/2016 | Satoh | H01J 37/3045 |
| | | | | 250/492.21 |
| 2018/0350559 A1 | * | 12/2018 | Matsushita | H01J 27/024 |

FOREIGN PATENT DOCUMENTS

| FR | 1261249 A | * | 5/1961 | .............. H01J 49/30 |
| JP | 2008-084679 | | 4/2008 | |

* cited by examiner

*Primary Examiner* — James Choi
(74) *Attorney, Agent, or Firm* — Amin, Turocy & Watson LLP

(57) ABSTRACT

Provided is a mass separator (100) for performing mass separation for an ion beam (IB). The mass separator (100) includes a transfer structure (30) that is a component of a yoke (13) and move at least one of an upper yoke (13a) positioned over the beam path (L), a lower yoke (13b) positioned under the beam path (L), and a side yoke (13c, 13d) positioned at a side of the beam path (L) between a normal position (P) in the traveling of the ion beam (IB) and a retracted position (Q) that does not overlap with at least a part of the normal position (P); the yoke (13) is surrounding the beam path (L) and is made of a magnetic body.

14 Claims, 10 Drawing Sheets

MASS SEPARATOR USING RETRACTABLE MAGNETIC YOKE ON A BEAM BENDING PATH

BACKGROUND

1. Technical Field

The present disclosure relates to a mass separator used for an ion beam irradiation device.

2. Description of Related Art

In an ion beam irradiation device, a mass separator is used for sorting dopant ions with specific mass and valence from an ion beam.

The mass separator utilizes the feature of each ion contained in an ion beam that draws a circular orbit with respective radius which varies with mass and valence of each ion, by generating a magnetic field on a beam path.

As shown in Japanese patent publication 2008-084679, the specific constitution of a known mass separator includes a beam path bending at a predetermined curvature, a coil generating a magnetic field on the beam path, and a yoke that is surrounding the beam path together with the coil and is made of a magnetic body.

Accordingly, since the beam path is bent, sometimes the radius of an aforementioned circular orbit becomes too large or too small for some kinds of ions, so that some ions collide with the wall surface forming the beam path and accumulate there.

In view of the above, the beam path needs maintenance by periodic cleaning. During the maintenance, it is necessary to perform the operation of detaching and lifting the yoke by a crane and then moving the yoke to another place.

However, a large scale operation is necessary when using the crane in this way to move the yoke.

SUMMARY

Therefore, one object of the present disclosure is maintaining a beam path, such as cleaning the beam path, without the need of a large scale operation.

In particular, a mass separator according to the present disclosure is a mass separator for bending a traveling direction of an ion beam to perform mass separation from the ion beam, characterizing in that the mass separator comprises: a coil that is disposed around a beam path bending along the traveling direction of the ion beam; a yoke that is surrounding the beam path together with the coil and is made of a magnetic body; and a transfer structure which moves construction elements of the yoke between a normal position of the ion beam during its traveling and a retracted position of the ion beam that does not overlap with at least a part of the normal position when viewed from above and below, wherein the construction elements include at least an upper yoke at an upper position of the beam path, or a lower yoke at a lower position of the beam path.

The aforementioned mass separator includes a transfer structure which moves the upper yoke and/or the lower yoke from the normal position to the retracted position. Therefore, a large scale equipment such as a crane is not required for maintaining the beam path, and the beam path can be maintained without the need of a large scale operation.

According to another aspect of the present disclosure, the transfer structure includes: an fixing member that is fixed to the upper yoke or the lower yoke at the normal position; a lifting and lowering structure that lifts and/or lowers the fixing member; and a rotating structure that rotates the fixing member; wherein the fixing member is lifted and/or lowered by the lifting and lowering structure and rotated by the rotating structure, so that the upper yoke or the lower yoke fixed to the fixing member moves between the normal position and the retracted position.

Accordingly, an ample space for the maintenance staff to face and maintain the beam path can be ensured compared with a situation wherein the upper yoke and/or the lower yoke are temporarily detached and moved along a radial direction of the beam path because the upper yoke and/or the lower yoke is moved between the normal position and the retracted position through lifting, lowering and rotating.

According to another aspect of the present disclosure, the yoke includes at least two upper yokes or at least two lower yokes disposed along the beam path, and one of the upper yokes or one of the lower yokes is configured to be fixed in a state of overlapping with the another one of the upper yokes or the another one of the lower yokes, and move to the retracted position together with another one of the upper yokes or another one of the lower yokes when moving from the normal position to the retracted position.

Accordingly, the at least two upper yokes and/or the at least two lower yokes constituting the yoke can be overlapped even when the at least two upper yokes and/or the at least two lower yokes are detached, thus an ample space for operation can be ensured.

According to another aspect of the present disclosure, the transfer structure is disposed at a radial inside of the bent beam path.

Accordingly, space can be saved, and the broader space at the radial outside of the beam path can be effectively used as operation space for better operability.

According to another aspect of the present disclosure, the beam path has a predetermined curvature, and a rotation center of the fixing member which rotate by the rotating structure is substantially aligned with a curvature center of the beam path.

Accordingly, since the upper yoke and/or the lower yoke detached from the normal position move rotatingly toward the retracted position along the beam path, it can be ensured that the upper yoke and/or the lower yoke do not protrude into the radial inside or the radial outside of the beam path when being rotated or at the retracted position to improve safety and/or operability.

In particular, for substantially aligning the rotation center of the fixing member with the curvature center of the beam path, the rotating structure comprises a rotational axial member connected to the fixing member, and the rotational axial member is disposed at the curvature center of the beam path, for example.

According to another aspect of the present disclosure, the lifting and lowering structure lifts and/or lowers the fixing member along the rotational axial member.

Accordingly, the transfer structure can become a small and compact structure.

According to another aspect of the present disclosure, the transfer structure comprises a positioning surface that limits the lifting and/or the lowering of the fixing member by the lifting and lowering structure or the rotating of the fixing member by the rotating structure when the upper yoke or the lower yoke fixed to the fixing member is lifted and/or lowered or rotated to a predetermined position.

Accordingly, the upper yoke and/or the lower yoke can be easily and surely positioned at the predetermined position even when the lifting and lowering structure and/or the rotational axial member is manually operated.

The present disclosure mentioned above can maintain the beam path without the need of a large scale operation.

BRIEF DESCRIPTION OF THE DRAWINGS

The present disclosure can be more fully understood by reading the following descriptions of the embodiments, with reference made to the accompanying drawings.

DETAILED DESCRIPTION OF THE EMBODIMENTS

The following examples are used for illustrating the present disclosure. A person skilled in the art can easily conceive the other advantages and effects of the present disclosure, based on the disclosure of the specification. The present disclosure can also be implemented or applied as described in different examples. It is possible to modify or alter the following examples for carrying out this disclosure without contravening its spirit and scope, for different aspects and applications.

It should be noted that, as used in this disclosure, the singular forms "a," "an," and "the" include plural referents unless expressly and unequivocally limited to one referent. The phrase "and/or" indicates that a plurality of features, elements or components are to be taken individually or some of the features, the elements or the components are to be taken together.

Figure 1:
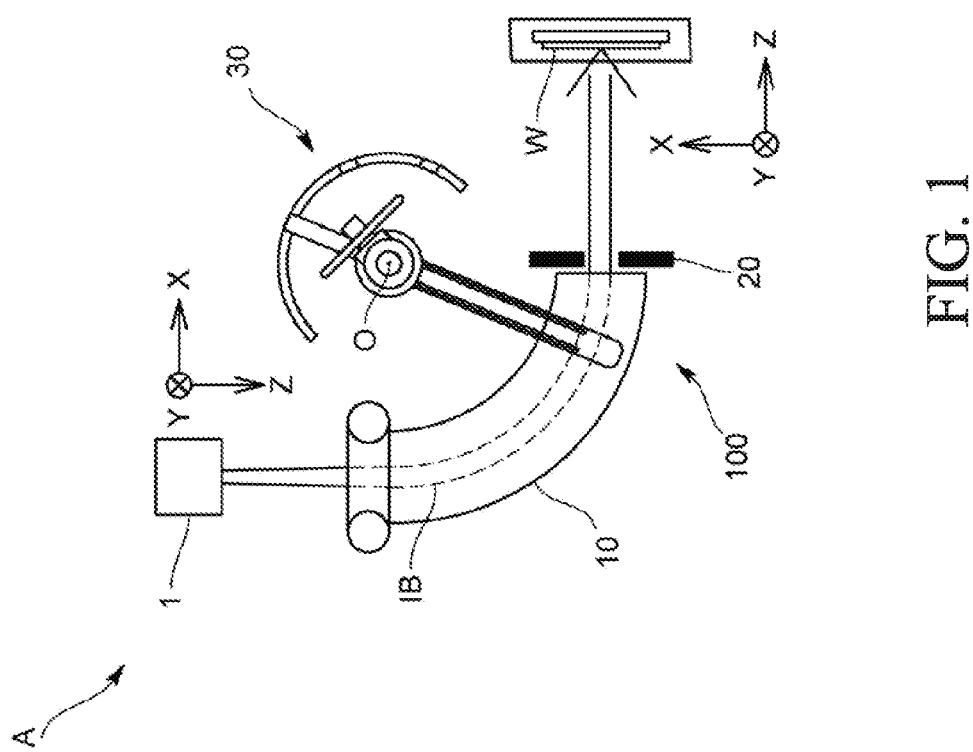
FIG. 1 is a schematic diagram showing the overall constitution of an ion beam irradiation device according to an embodiment.

As shown in FIG. 1, the mass separator 100 of this embodiment constitutes the ion beam irradiation device A. The ion beam irradiation device A is briefly described first.

The ion beam irradiation device A is, for example, an ion implanting device for implanting ions by irradiating the substrate W with an ion beam IB. In particular, the ion beam irradiation device A includes an ion source 1 which generates the ion beam IB, and a mass separator 100 which sort dopant ions with specific mass and valence from the ion beam IB. The ion beam irradiation device A is not limited to an ion implanting device. For example, the ion beam irradiation device A can be an ion beam etching device, etc.

Moreover, the ion beam irradiation device A can further include an acceleration/deceleration tube which accelerate or decelerate the ion beam IB output by the mass separator 100, and/or an energy separator which is disposed at the downstream side of the acceleration/deceleration tube and sort and output ions with specific energy from the ion beam IB, and/or a substrate driving device configured to move the substrate W along a direction crossing the traveling direction of the ion beam IB, etc.

The ion beam IB is a strip, ribbon or slice that is, for example, longer in a certain direction and has thickness in a direction perpendicular to the length direction, wherein the traveling direction of the ion beam IB is defined as Z direction, and two substantially orthogonal directions in a plane substantially perpendicular to the Z direction are defined as X direction and Y direction. For example, the X direction is the thickness direction of the ion beam IB and the Y direction is the length direction of the ion beam IB. The X direction and the Z direction are horizontal directions, while the Y direction is a vertical direction. Moreover, the Y direction is a fixed direction. The X direction and the Z direction are not absolute directions. Instead, the X direction and the Z direction changes along the traveling direction of the ion beam IB (for example, please refer to FIG. 1 and FIG. 2).

Next, the mass separator 100 is explained below.

As shown in FIG. 1, the mass separator 100 includes a mass separation magnet 10 which bend the traveling direction of the ion beam IB, and a separation slit 20 which is disposed at the downstream of the mass separation magnet 10 and cooperate with the mass separation magnet 10 to allow the dopant ions in the ion beam IB to pass through.

Figure 2:
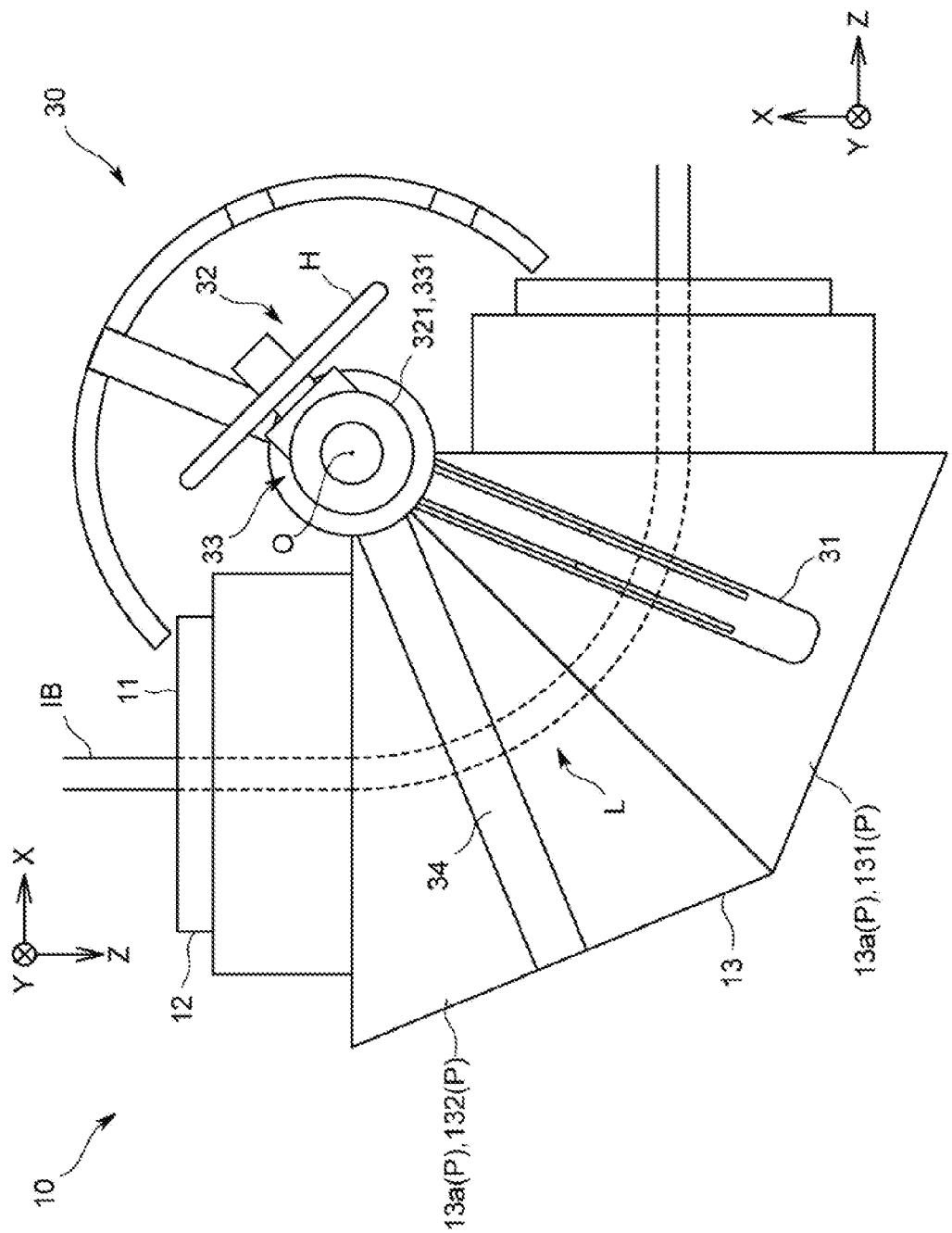
FIG. 2 is a schematic diagram showing the constitution of a mass separation magnet and a transfer structure according to the same embodiment.

In more detail, please refer to FIG. 2. The mass separation magnet 10 bends the traveling direction of the ribbon-shaped ion beam IB in a way having a curvature in the thickness direction of the ion beam IB (the X direction). In particular, the mass separation magnet 10 includes a vacuum container 11 which form a beam path L of a channel belonging to the ion beam IB, a coil 12 disposed around the beam path L, and a yoke 13 surrounding the beam path L together with the coil 12. The yoke 13 is made of a ferromagnetic body.

The vacuum container 11 is a non-magnetic body that maintains a vacuum environment during the traveling of the ion beam IB, and the internal space of the vacuum container 11 forms the beam path L. The beam path L formed in the vacuum container 11 bends with a predetermined curvature when viewed from an up-down direction (the Y direction) and is in a partial arc shape at this curvature radius.

Figure 3:
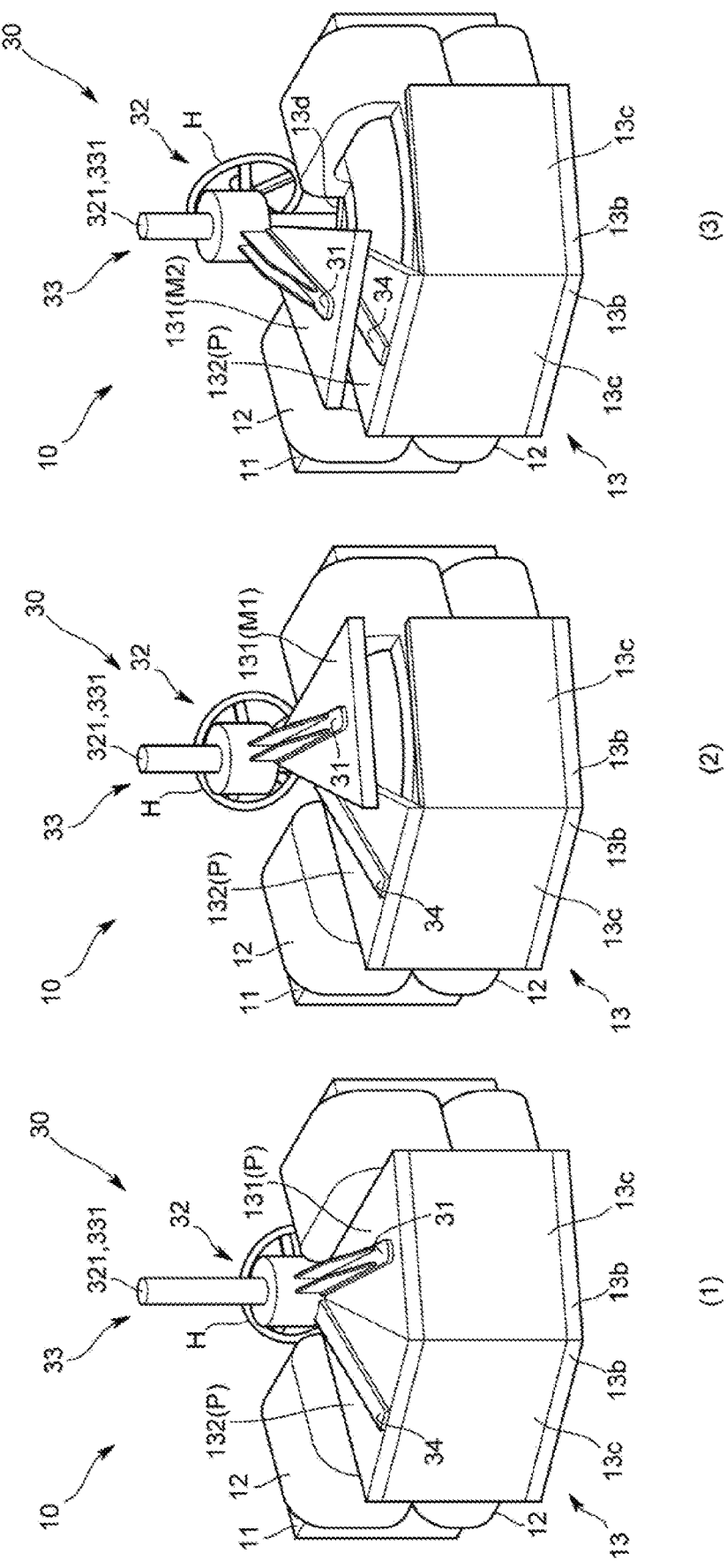
FIG. 3 is a schematic diagram illustrating the detaching of the yoke using the transfer structure of the same embodiment.
Figure 4:
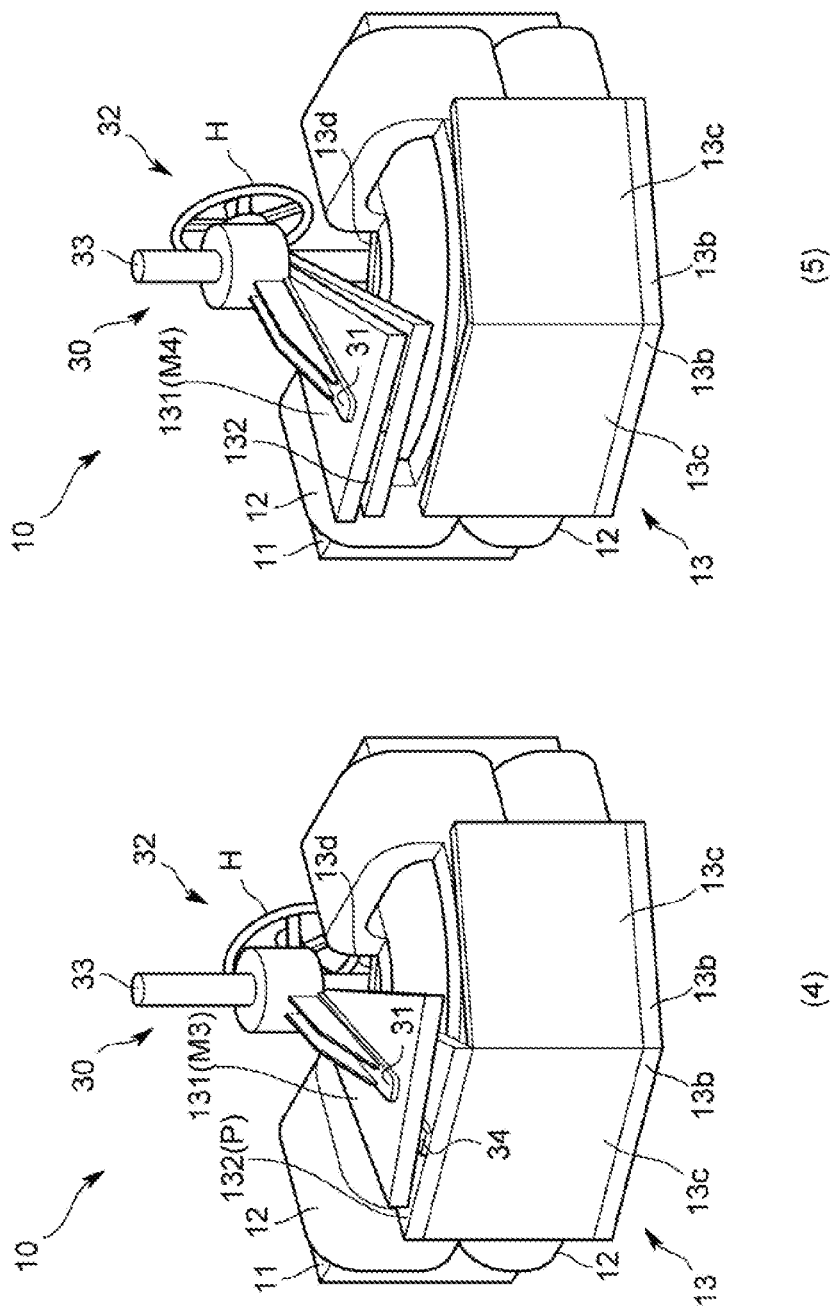
FIG. 4 is a schematic diagram illustrating the detaching of the yoke using the transfer structure of the same embodiment.

The coil 12 is formed by winding a conductor wire, as shown in FIG. 3 and FIG. 4. The coil 12 is disposed at opposite sides to surround the ion beam IB in the Y direction (the length direction of the ion beam IB), and then a current through the coil 12 triggers the coil 12 to generate a magnetic field along the Y direction in the beam path L to bend the traveling direction of the ion beam IB.

The yoke 13 is disposed around the vacuum container 11, i.e., around the beam path L, to reduce outward leakage of the magnetic field.

As shown in FIG. 3 and FIG. 4, the yoke 13 is constituted by at least one upper yoke 13a positioned over the beam path L, at least one lower yoke 13b positioned under the beam path L, at least one outer yoke 13c positioned at a radial outside of the beam path L, and at least one inner yoke 13d positioned at a radial inside of the beam path L. The yoke 13 surrounds at least a part of the entire perimeter of the beam path L.

In this embodiment, at least all of the upper yokes 13a can be detached from the yoke 13, wherein a plurality of upper yokes 13a (in particular, two pieces of upper yokes 13a) are laid along the beam path L with no gap between the upper yokes 13a.

As shown in FIG. 2 to FIG. 7, the mass separator 100 here further includes a transfer structure 30 that moves at least the upper yoke 13a between a normal position P corresponding to the traveling of the ion beam IB and a retracted position Q not overlapped with at least a part of the normal position P when viewed in an up-down direction.

Herein, the normal position P is a position of the upper yoke 13a when the entire yoke 13 is in a fully assembled state. In other words, the normal position P is a position of the upper yoke 13a when the upper yoke 13a, the lower yoke 13b, the outer yoke 13c and the inner yoke 13d are in a state of surrounding the vacuum container 11 together.

On the other hand, the retracted position Q is a position for opening the internal space of the vacuum container 11, i.e., opening the beam path L. The retracted position Q is also a position of the upper yoke 13a for maintaining the beam path L. In this embodiment, when view from above, the retracted position Q of an upper yoke 13a is a position where all of the upper yoke 13a do not overlap with the normal position P of the upper yoke 13a. Moreover, herein, a plurality of the upper yokes 13a are detached from the normal position P when the beam path L is maintained. Therefore, when viewed from above, the retracted position Q is a position where all of the upper yoke 13a not only does not overlap with the normal position P of the upper yoke 13a but also does not overlap with the normal positions P of the other upper yokes 13a.

The transfer structure 30 is usually partly or entirely disposed at the mass separation magnet 10. The transfer structure 30 includes an fixing member 31 fixed to an upper yoke 13a at the normal position P, a lifting and lowering structure 32 which lift or lower the fixing member 31, and a rotating structure 33 which rotate the fixing member 31. Moreover, the fixing member 31 is configured to be lifted and/or lowered by the lifting and lowering structure 32 and rotated by the rotating structure 33 to move the upper yoke 13a fixed to the fixing member 31 between the normal position P and the retracted position Q.

As shown in FIG. 2, the transfer structure 30 here is disposed at a radial inside of the beam path L relative to the mass separation magnet 10, and the transfer structure 30 is at least partly integrated with the mass separation magnet 10.

The fixing member 31 is fixed to the upper yoke 13a in an unshakable manner. The fixing member 31 is for example a plate in contact with at least a part of an upper surface of the upper yoke 13a. Herein, the fixing member 31 is fixed to a plurality of positions on the upper yoke 13a. In particular, the fixing member 31 is fixed to the upper yoke 13a by fastening members such as screws not shown in the drawings. Moreover, the fixation of the fixing member 31 to the upper yoke 13a is not limited to use the fastening members. Any method capable of fixation can be used. In addition, the fixing member 31 does not have to be in contact with the upper yoke 13a. For example, a connecting member not shown in the drawings can be disposed in advance on the upper surface of the upper yoke 13a and the fixing member 31 can be fixed to the upper yoke 13a through the connecting member.

The lifting and lowering structure 32 lifts and/or lowers the upper yoke 13a fixed to the fixing member 31 by lifting and/or lowering the fixing member 31. Herein, the lifting and lowering structure 32 is operated manually. For example, the lifting and lowering structure 32 lifts the fixing member 31 when the operation handle H is rotated forward and lowers the fixing member 31 when the operation handle H is rotated backward. Furthermore, the lifting and lowering structure 32 can also lift and/or lower the fixing member 31 by power from a power source such as a motor.

The lifting and lowering structure 32 includes an axial member 321 extending along an up-down direction. The lifting and lowering structure 32 is configured to lift and/or lower the fixing member 31 along the axial member 321.

The rotating structure 33 rotatingly moves the fixing member 31 in a plane (horizontal plane). The rotating structure 33 includes a rotational axial member 331 connected to the fixing member 31. The rotational axial member 331 is freely rotatable. Herein, the rotating structure 33 is configured to be capable of rotating the rotational axial member 331 by manual operation. The rotational axial member 331 and the axial member 321 is a common component. The fixing member 31 can be lifted, lowered and rotatingly moved by the common axial member 321, 331. Moreover, the fixing member 31 can be rotationally moved by power from a power source such as a motor.

The rotating structure 33 is configured to substantially align the rotation center of the fixing member 31 with the curvature center O of the beam path L. In particular, as shown in FIG. 2, the rotational axial member 331 is disposed on the curvature center O of the beam path L when viewed from above. Moreover, the rotational axial member 331 and the fixing member 31 can be separate parts. Alternatively, the rotational axial member 331 can be integrated with the fixing member 31. Herein, the rotational axial member 331 and the fixing member 31 are lifted and/or lowered together.

A method for moving the upper yoke 13a by the transfer structure 30 from the normal position P to the retracted position Q through a plurality of intermediate positions are explained below with reference to FIG. 3 to FIG. 8. Herein, the yoke 13 includes two upper yokes 13a adjacently connected to each other. The two upper yokes 13a are respectively referred to as the first yoke 131 and the second yoke 132 hereinafter. The detaching of the two upper yokes 13a is explained below. In addition, the reference numeral 13a is omitted in FIG. 3 to FIG. 8. However, the number of the upper yokes 13a is not limited to two. The number of the upper yokes 13a can be one, three or more. In addition, the reference sign 12 is omitted in FIG. 6 to FIG. 8.

Figure 6:
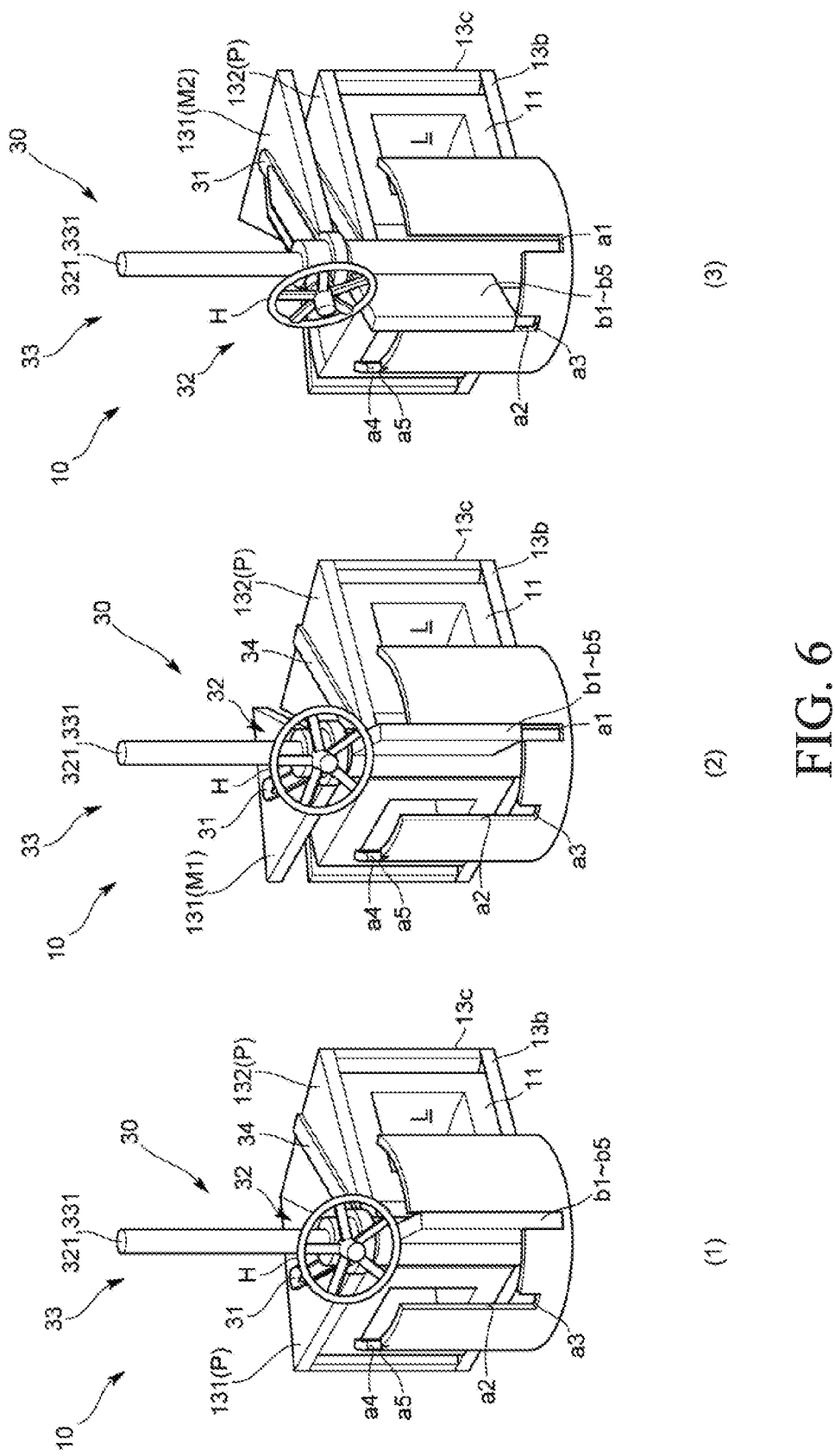
FIG. 6 is a schematic diagram illustrating the detaching of the yoke using the transfer structure of the same embodiment.

First, move the fixing member 31 to an upper side of the first yoke 131 and fix the fixing member 31 to the first yoke 131 (FIG. 3(1), FIG. 6(1)). Herein, the lifting and lowering structure 32 lower the fixing member 31 to a position in contact with the first yoke 131, and the fixing member 31 is fixed to the first yoke 131 by fastening members not shown in the drawings, such as screws.

Herein, during the lowering of the fixing member 31 to the first yoke 131, the fixing member 31 and/or the first yoke 131 can sustain excess force if the fixing member 31 is overly lowered, which can possibly damage or break the fixing member 31 and/or the first yoke 131.

Figure 7:
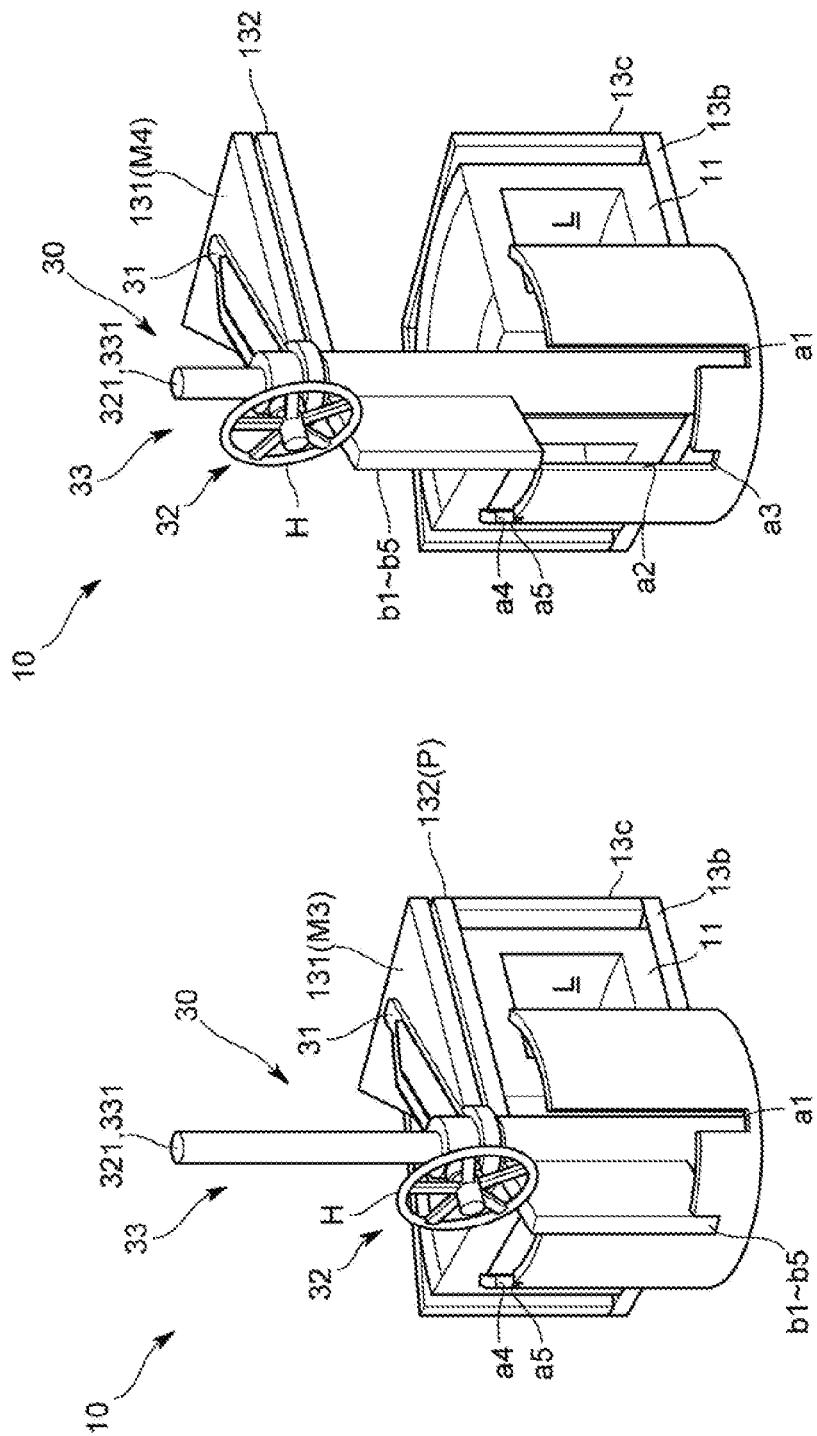
FIG. 7 is a schematic diagram illustrating the detaching of the yoke using the transfer structure of the same embodiment.
Figure 8:
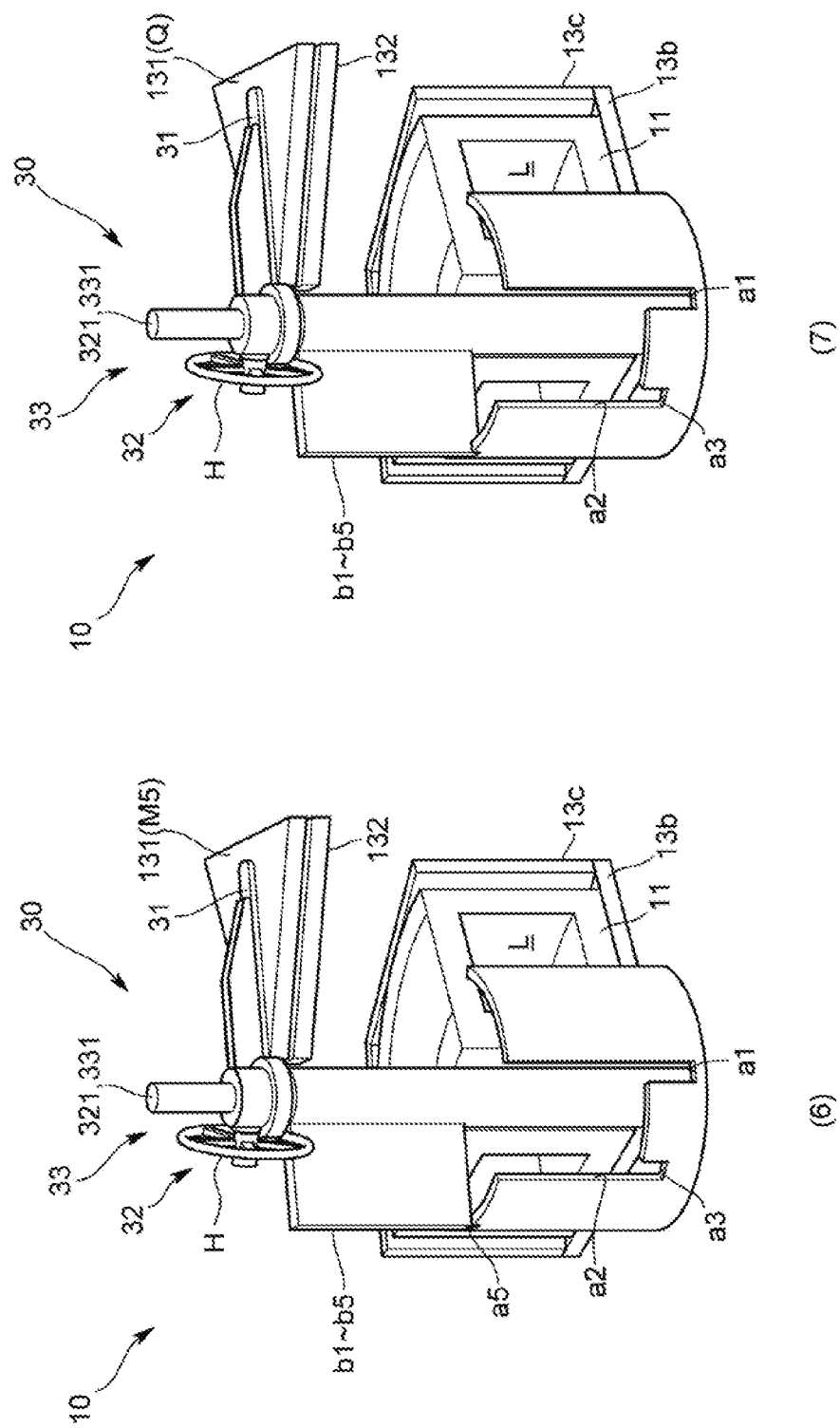
FIG. 8 is a schematic diagram illustrating the detaching of the yoke using the transfer structure of the same embodiment.

Therefore, as shown in FIG. 6 to FIG. 8, the transfer structure 30 in this embodiment includes a first positioning surface a1 which limit the lowering of the fixing member 31 and position the fixing member 31 when the fixing member 31 is lowered to contact the first yoke 131.

In particular, the first positioning surface a1 is a surface disposed around the rotational axial member 331 and for example facing upward. Moreover, the lifting and lowering structure 32 includes a first abutting portion b1 which abuts the first positioning surface a1 when the first abutting portion b1 is lifted and lowered together with the fixing member 31 to bring the fixing member 31 to contact the first yoke 131.

In this way, the first abutting portion b1 abuts the first positioning surface a1 and the fixing member 31 is positioned on the upper surface of the first yoke 131.

Next, the fixing member 31 is lifted by the lifting and lowering structure 32 to lift the first yoke 131 from the normal position P to a first intermediate position M1 above the normal position P (FIG. 3(2), FIG. 6(2)) while maintaining the first yoke 131 at the same orientation as the normal position P, i.e., maintaining the first yoke 131 in a level plane. The difference of height between the first intermediate position M1 and the normal position P is at least the thickness of the second yoke 132. The aforementioned difference of height can vary in each operation if the first yoke 131 is entirely above the second yoke 132.

Next, the fixing member 31 and the rotational axial member 331 are rotated together to rotate the first yoke 131 from the first intermediate position M1 to a second intermediate position M2 above the second yoke 132 (FIG. 3(3), FIG. 6(3)) while maintaining the first yoke 131 at the height of the first intermediate position M1. Moreover, at this time, since the rotational axial member 331 is disposed at the curvature center O of the beam path L as mentioned above, the first yoke 131 is rotated along a circular orbit having the same curvature radius as that of the beam path L.

Herein, preferably, when view from above, the second intermediate position M2 is a position where at least a part of the first yoke 131 overlaps with the second yoke 132. Preferably, the second intermediate position M2 is disposed right above a third intermediate position M3 that is described later. In view of this matter, the rotation angle from the first intermediate position M1 to the second intermediate position M2 is preferably constant in each operation.

Therefore, as shown in FIG. 6 to FIG. 8, the transfer structure 30 in this embodiment includes a second positioning surface a2 which limit the rotating of the fixing member 31 and position the first yoke 131 at the second intermediate position M2 when the first yoke 131 is rotated from the first intermediate position M1 to the second intermediate position M2.

In particular, the second positioning surface a2 is disposed around the rotational axial member 331 and the second positioning surface a2 is for example a vertical surface along the rotational axial member 331. In addition, the rotating structure 33 includes a second abutting portion b2 which abut the second positioning surface a2 when the second abutting portion b2 is rotated together with the fixing member 31 so that the fixing member 31 is rotated for a predetermined angle from where the first yoke 131 is at the first intermediate position M1.

The aforementioned predetermined angle is equivalent to the rotation angle from the first intermediate position M1 to the second intermediate position M2. In this way, the first yoke 131 is positioned at the second intermediate position M2 by the second abutting portion b2 abutting the second positioning surface a2.

Next, lower the fixing member 31 by the lifting and lowering structure 32 to lower the first yoke 131 from the second intermediate position M2 to the third intermediate position M3 (FIG. 4(4), FIG. 7(4)) while maintaining the first yoke 131 at the same orientation as the second intermediate position M2. The third intermediate position M3 is a position of the first yoke 131 that can connect the first yoke 131 and the second yoke 132. The third intermediate position M3 is also a position where the lower surface of the first yoke 131 contacts the second yoke 132 or a connecting member 34 disposed on the second yoke 132.

In this embodiment, the connecting member 34 is disposed on an upper surface of the second yoke 132. The first yoke 131 can be fixed to the connecting member 34 by fastening members such as screws not shown in the drawings. The first yoke 131 and the second yoke 132 can be connected directly without the connecting member 34. Alternatively, the first yoke 131 can be connected to the second yoke 132 through the fixing member 31 by connecting the second yoke 132 to the fixing member 31.

Herein, during the lowering of the first yoke 131 from the second intermediate position M2 to the third intermediate position M3, the second yoke 132 and/or the connecting member 34 can sustain excess force if the first yoke 131 is wrongly intended to be lowered to under the third intermediate position M3, which can possibly damage or break the second yoke 132 and/or the connecting member 34.

Therefore, as shown in FIG. 6 to FIG. 8, the transfer structure 30 in this embodiment includes a third positioning surface a3 which limit the lowering of the fixing member 31 and position the first yoke 131 at the third intermediate position M3 when the first yoke 131 is lowered from the second intermediate position M2 to the third intermediate position M3.

In particular, the third positioning surface a3 is a surface disposed around the rotational axial member 331 and for example connected to the second positioning surface a2 and facing upward. In addition, the lifting and lowering structure 32 includes a third abutting portion b3 which abut the third positioning surface a3 when the third abutting portion b3 is lifted and/or lowered together with the fixing member 31 so that the fixing member 31 is lowered for a predetermined distance from where the first yoke 131 is at the second intermediate position M2. Moreover, the third abutting portion b3 is integrated with the second abutting portion b2 in a common part or member.

The aforementioned predetermined distance is equivalent to the distance of moving from the second intermediate position M2 to the third intermediate position M3. In this way, the first yoke 131 is positioned at the third intermediate position M3 by the third abutting portion b3 abutting the third positioning surface a3.

After connecting the first yoke 131 and the second yoke 132 to integrate the fixing member 31, the first yoke 131 and the second yoke 132, lift the fixing member 31 again by the lifting and lowering structure 32 to lift the first yoke 131 from the third intermediate position M3 to a fourth intermediate position M4 (FIG. 4(5), FIG. 7(5)) while maintaining the first yoke 131 in the orientation of the third intermediate position M3. The fourth intermediate position M4 can be disposed anywhere as long as the integrated fixing member 31, the first yoke 131 and the second yoke 132 are entirely above the mass separation magnet 10, in particular, entirely above the coil 12, even if the height from the third intermediate position M3 to the fourth intermediate position M4 is varied in each operation.

And, at least rotate the first yoke 131 at the fourth intermediate position M4 to move to the retracted position Q. However, the retracted position Q is disposed under a fifth intermediate position M5. The first yoke 131 is firstly moved from the fourth intermediate position M4 to the fifth intermediate position M5 and then lowered from the fifth intermediate position M5 to the retracted position Q. Alternatively, the retracted position Q can be disposed at a position of the first yoke 131 after the first yoke 131 is rotated from the fourth intermediate position M4.

Figure 5:
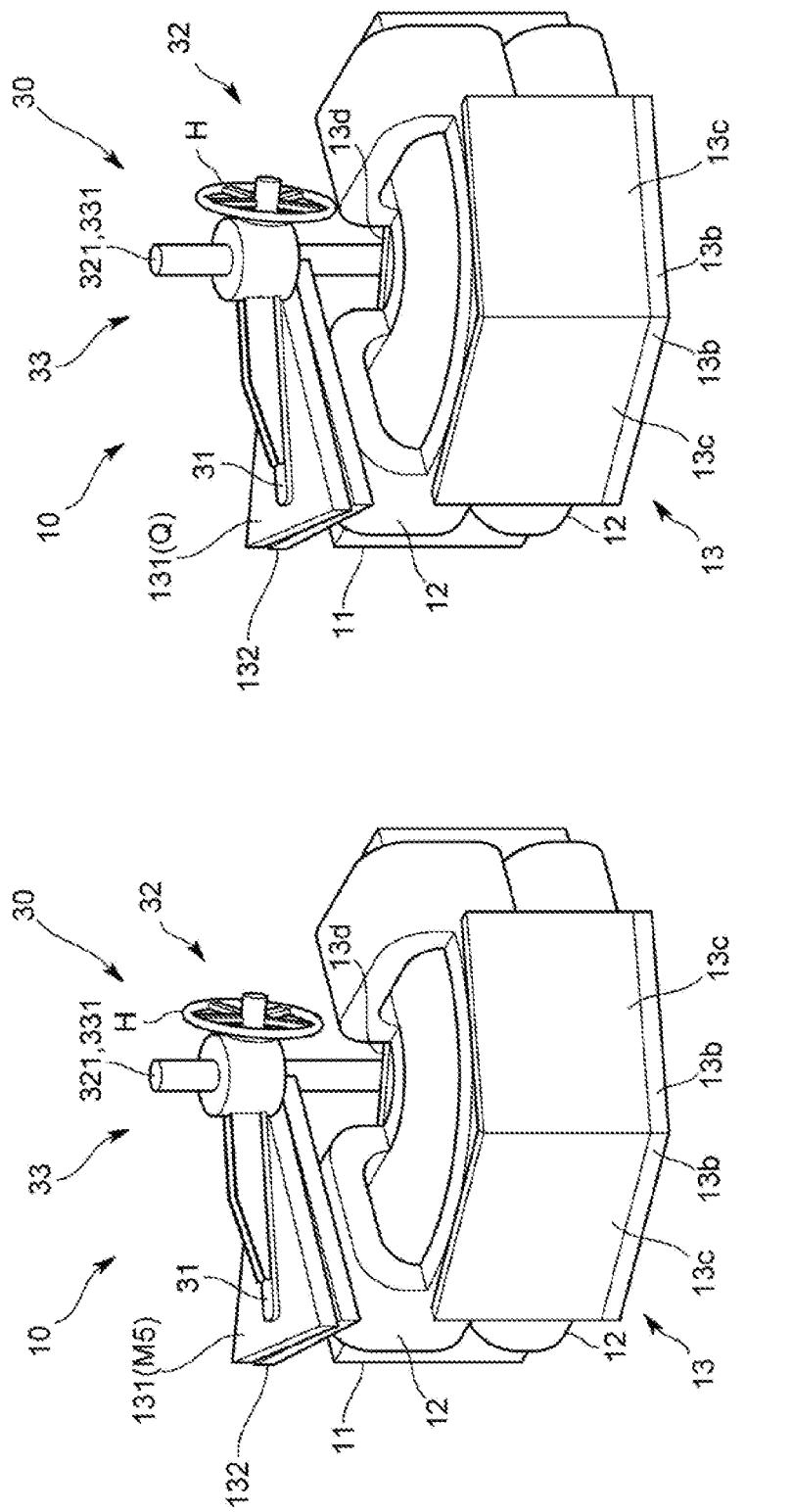
FIG. 5 is a schematic diagram illustrating the detaching of the yoke using the transfer structure of the same embodiment.

In particular, rotate the fixing member 31 and the rotational axial member 331 together from where the first yoke 131 is at the fourth intermediate position M4 to rotate the first yoke 131 from the fourth intermediate position M4 to the fifth intermediate position M5 (FIG. 5(6), FIG. 8(6)) while maintaining the first yoke 131 at the height of the fourth intermediate position M4. The fourth intermediate position M4 is set as a position where the first yoke 131 and the second yoke 132 do not overlap with both of the normal position P of the first yoke 131 and the normal position P of the second yoke 132 when viewed from above.

Herein, the first yoke 131 and the second yoke 132 can overlap with the normal position P of the second yoke 132 when viewed from above if the rotation angle from the fourth intermediate position M4 to the fifth intermediate position M5 is too small. The first yoke 131 and the second yoke 132 can be unnecessarily rotated if the aforementioned rotation angle is too large.

Therefore, as shown in FIG. 6 to FIG. 8, the transfer structure 30 in this embodiment includes a fourth positioning surface a4 which limit the rotating of the fixing member 31 and position the first yoke 131 at the fifth intermediate position M5 when the first yoke 131 is rotated from the fourth intermediate position M4 to the fifth intermediate position M5.

In particular, the fourth positioning surface a4 is disposed around the rotational axial member 331 and the fourth positioning surface a4 is for example a vertical surface along the rotational axial member 331. In addition, the rotating structure 33 includes a fourth abutting portion b4 which abut the fourth positioning surface a4 when the fourth abutting portion b4 is rotated together with the fixing member 31 so that the first yoke 131 is rotated for a predetermined angle from the fourth intermediate position M4. Moreover, the fourth abutting portion b4 is integrated with the second abutting portion b2 and/or the third abutting portion b3 in a common part or member.

The aforementioned predetermined angle is at least an angle required by the condition that the first yoke 131 and the second yoke 132 do not overlap with both of the normal position P of the first yoke 131 and the normal position P of the second yoke 132 when viewed from above. In this way, the first yoke 131 is positioned at the fifth intermediate position M5 by the fourth abutting portion b4 abutting the fourth positioning surface a4.

As mentioned above, when the first yoke 131 reaches the fifth intermediate position M5, the first yoke 131 and the second yoke 132 do not overlap with both of the normal position P of the first yoke 131 and the normal position P of the second yoke 132 when viewed from above. Therefore, the beam path L can be maintained, for example, cleaned, after detaching the cover of the vacuum container 11. However, the first yoke 131 at the fifth intermediate position M5 can rotate freely in the direction towards the fourth intermediate position M4, which can possibly interfere with the maintenance and cause the first yoke 131 to rotate unexpectedly.

Therefore, as shown in FIG. 6 to FIG. 8, the transfer structure 30 in this embodiment includes a positioning groove a5 which limits the lowering and the rotation of the fixing member 31 when the first yoke 131 is lowered from the fifth intermediate position M5 to the retracted position Q.

In particular, the positioning groove a5 is disposed around the rotational axial member 331 and the positioning groove a5 is a groove facing upward formed based on the fourth positioning surface a4. In addition, the lifting and lowering structure 32 includes a contained portion b5 which is contained in the positioning groove a5 when the contained portion b5 is lifted and/or lowered together with the fixing member 31 so that the first yoke 131 is lowered for a predetermined distance from the fifth intermediate position M5. Moreover, the contained portion b5 is integrated with the second abutting portion b2, the third abutting portion b3 and the fourth abutting portion b4 in a common part or member.

The aforementioned predetermined distance is equivalent to the distance of moving from the fifth intermediate position M5 to the retracted position Q. In this way, the rotation and the lowering of the fixing member 31 are limited by the contained portion b5 contained in the positioning groove a5 when the first yoke 131 reaches the retracted position Q.

Therefore, when the fixing member 31 is lowered by the lifting and lowering structure 32 so that the first yoke 131 is lowered from the fifth intermediate position M5 to the retracted position Q and meanwhile the first yoke 131 is maintained in the orientation of the fifth intermediate position M5, as shown in FIG. 8, the first yoke 131 and the second yoke 132 do not overlap with both of the normal position P of the first yoke 131 and the normal position P of the second yoke 132 when viewed from above. Consequently, the beam path L can be maintained, for example, cleaned, after detaching the cover of the vacuum container 11.

Moreover, the transfer structure 30 can also be used to move the upper yoke 13a to the normal position P from the retracted position Q after the maintenance. In such an operation, the steps of detaching the upper yoke 13a can be reversed to move the upper yoke 13a to the normal position P from the retracted position Q through the intermediate positions.

The mass separator 100 according to the aforementioned constitution does not need a large scale equipment such as a crane for maintaining the beam path L and does not make the maintenance of the beam path L cumbersome because the transfer structure 30 can be used to move the upper yoke 13a to the retracted position Q.

In addition, an ample space for the maintenance staff to face and maintain the beam path L can be ensured compared with a situation wherein the detached upper yoke 13a glides along a radial direction of the beam path L because the upper yoke 13a detached from the normal position P is rotated and moved to the retracted position Q.

Moreover, an ample space for operation can be ensured because the two upper yokes 13a can be overlapped and fixed to each other while being detached.

Furthermore, the transfer structure 30 is disposed at the radial inside of the beam path L, which saves space and effectively use the broader space at the radial outside of the beam path L.

In addition, since the rotation center of the fixing member 31 formed by the rotational axial member 331 is substantially aligned with the curvature center O of the beam path L, the first yoke 131 and/or the second yoke 132 detached from the normal position P move toward the retracted position Q by rotating along the beam path L. In this way, it can be ensured that the first yoke 131 and/or the second yoke 132 do not protrude into the radial inside or the radial outside of the beam path L to improve safety and operability.

Besides, since the transfer structure 30 includes the second positioning surface a2 for positioning the first yoke 131 at the second intermediate position M2 and/or the third positioning surface a3 for positioning the first yoke 131 at the third intermediate position M3 and/or the fourth positioning surface a4 for positioning the first yoke 131 at the fifth intermediate position M5 and/or the positioning groove a5 for positioning the first yoke 131 at the retracted position Q, the first yoke 131 can be easily and surely positioned at the predetermined second intermediate position M2 and/or the third intermediate position M3 and/or the fifth intermediate position M5 and/or the retracted position Q to improve operability when the lifting and lowering structure 32 and/or the rotational axial member 331 is manually operated.

Furthermore, the present disclosure is not limited to the aforementioned embodiments.

Figure 9:
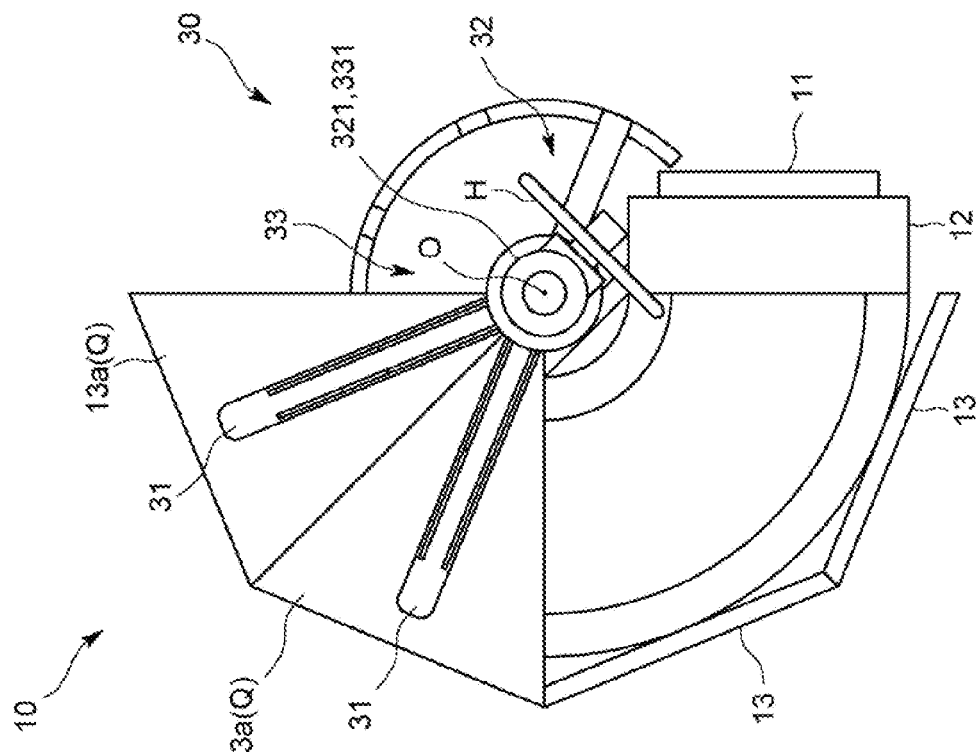
FIG. 9 is a schematic diagram illustrating the detaching of the yoke using a transfer structure of another embodiment.
Figure 9:
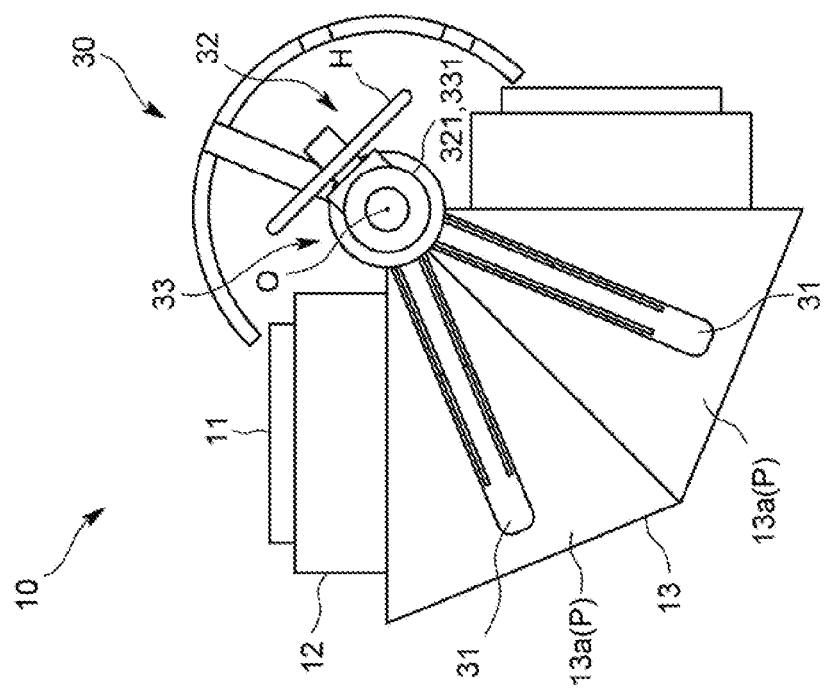

For example, although the plurality of the upper yokes 13a are rotated and moved to the retracted position Q in an overlapped and integrated state, the plurality of the upper yokes 13a can also be rotated and moved to the retracted position Q in a non-overlapped state as shown in FIG. 9.

Figure 10:
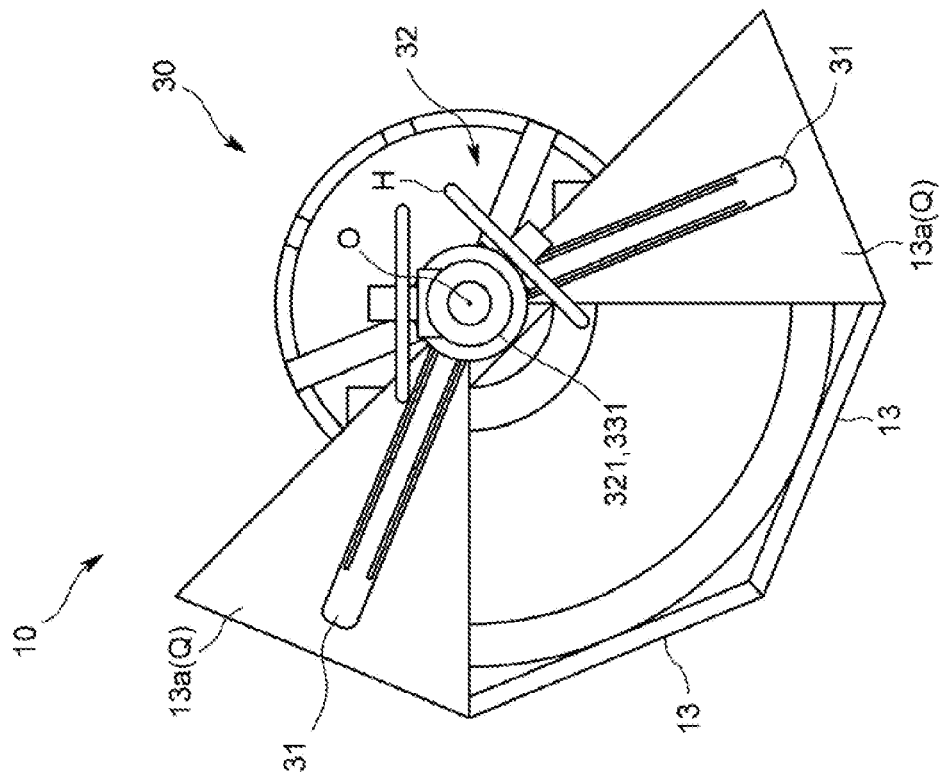
FIG. 10 is a schematic diagram illustrating the detaching of the yoke using a transfer structure of another embodiment.
Figure 10:
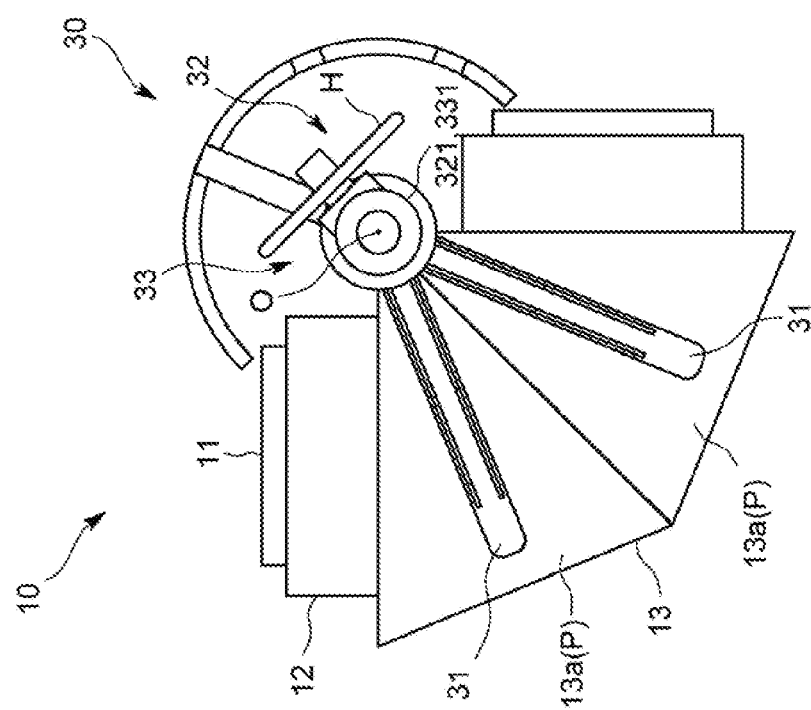

Moreover, as shown in FIG. 10, the upper yokes 13a can be rotated and moved to retracted positions Q along circular orbits whose directions are opposite to each other.

Moreover, the operation of detaching the upper yoke 13a by the transfer structure 30 is already described. The transfer structure 30 can also be used to detach the lower yoke 13b, the outer yoke 13c and/or the inner yoke 13d.

Besides, the transfer structure 30 is not limited to be disposed at the radial inside relative to the mass separation magnet 10. The transfer structure 30 can also be disposed at the radial outside relative to the mass separation magnet 10.

Moreover, the rotational axial member 331 is not limited to be disposed at the curvature center O of the beam path L. For example, the rotational axial member 331 can be disposed at a position beside the curvature center O and/or away from the curvature center O.

Moreover, the transfer structure 30 is not limited to lift, lower and rotate the upper yoke 13a and/or the lower yoke 13b. The transfer structure 30 can also be constituted to move the upper yoke 13a and/or the lower yoke 13b between the normal position P and the retracted position Q through upward movement, downward movement and parallel movement.

While some of the embodiments of the present disclosure have been described in detail above, it is, however, possible for those of ordinary skill in the art to make various modifications and changes to the particular embodiments shown without substantially departing from the teaching and advantages of the present disclosure. Such modifications and changes are encompassed in the spirit and scope of the present disclosure as set forth in the appended claims.

What is claimed is:

1. A mass separator for bending a traveling direction of an ion beam to perform mass separation from the ion beam, the mass separator comprising:
    a vacuum container in which a beam path is formed;
    a coil that is disposed around the beam path bending along the traveling direction of the ion beam;
    a yoke that is surrounding the beam path together with the coil and is made of a magnetic body, wherein the yoke is disposed around the vacuum container; and
    a transfer structure that moves construction elements of the yoke between a normal position which corresponds to a fully assembled state of the yoke and a retracted position that does not overlap with at least a part of the normal position when viewed from above and below, wherein the construction elements include at least an upper yoke at an upper position of the beam path, or a lower yoke at a lower position of the beam path, wherein the transfer structure comprises:
    a fixing member that is fixed to the upper yoke or lower yoke at the normal position;
    a lifting and lowering structure that lifts and/or lowers the fixing member, when viewed from the side; and
    a rotating structure that rotates the fixing member, when viewed from above,
    wherein the fixing member is lifted and/or lowered by the lifting and lowering structure and rotated by the rotating structure, so that the upper yoke or the lower yoke fixed to the fixing member moves between the normal position and the retracted position;
    wherein at least two said upper yokes or at least two said lower yokes are disposed along the beam path side by side at the normal position; and
    wherein one of the upper yokes or one of the lower yokes is configured to be fixed in a state of overlapping with another one of the upper yokes or another one of the lower yokes, and move to the retracted position together with another one of the upper yokes or another one of the lower yokes when moving from the normal position to the retracted position.

2. The mass separator according to claim 1, wherein one of the upper yokes is configured to be overlapping vertically with another one of the upper yokes during a lifting or lowering period of the fixing member, or wherein one of the lower yokes is configured to be overlapping vertically with another one of the lower yokes during the lifting or lowering period of the fixing member.

3. The mass separator according to claim 1, wherein the transfer structure is disposed at a radial inside of a bent beam path.

4. The mass separator according to claim 2, wherein the transfer structure is disposed at a radial inside of a bent beam path.

5. The mass separator according to claim 1, wherein the transfer structure is disposed at a radial inside of the beam path which is bending.

6. The mass separator according to claim 1, wherein
    the beam path has a predetermined curvature, and
    a rotation center of the fixing member which rotate by the rotating structure is substantially aligned with a curvature center of the predetermined curvature of the beam path.

7. The mass separator according to claim 2, wherein
    the beam path has a predetermined curvature, and
    a rotation center of the fixing member which rotate by the rotating structure is substantially aligned with a curvature center of the predetermined curvature of the beam path.

8. The mass separator according to claim 3, wherein
    the beam path has a predetermined curvature, and
    a rotation center of the fixing member which rotate by the rotating structure is substantially aligned with a curvature center of the predetermined curvature of the beam path.

9. The mass separator according to claim 4, wherein
    the beam path has a predetermined curvature, and
    a rotation center of the fixing member which rotate by the rotating structure is substantially aligned with a curvature center of the predetermined curvature of the beam path.

10. The mass separator according to claim 5, wherein
the beam path has a predetermined curvature, and
a rotation center of the fixing member which rotate by the rotating structure is substantially aligned with a curvature center of the predetermined curvature of the beam path.

11. The mass separator according to claim 6, wherein
the rotating structure comprises a rotational axial member connected to the fixing member, and
the rotational axial member is disposed at the curvature center of the predetermined curvature of the beam path.

12. The mass separator according to claim 11, wherein the lifting and lowering structure lifts and/or lowers the fixing member along the rotational axial member.

13. The mass separator according to claim 1, wherein the transfer structure comprises a positioning surface that limits the lifting and/or the lowering of the fixing member by the lifting and lowering structure or the rotating of the fixing member by the rotating structure when the upper yoke or the lower yoke fixed to the fixing member is lifted and/or lowered or rotated to a predetermined position.

14. The mass separator according to claim 2, wherein the transfer structure comprises a positioning surface that limits the lifting and/or the lowering of the fixing member by the lifting and lowering structure or the rotating of the fixing member by the rotating structure when the upper yoke or the lower yoke fixed to the fixing member is lifted and/or lowered or rotated to a predetermined position.

\* \* \* \* \*